(12) United States Patent
Vogt

(10) Patent No.: US 12,184,289 B2
(45) Date of Patent: Dec. 31, 2024

(54) RADIO FREQUENCY DOUBLER

(71) Applicant: STMicroelectronics France, Montrouge (FR)

(72) Inventor: Lionel Vogt, La Rochette (FR)

(73) Assignee: STMicroelectronics France, Montrouge (FR)

( * ) Notice: Subject to any disclaimer, the term of this patent is extended or adjusted under 35 U.S.C. 154(b) by 0 days.

(21) Appl. No.: 18/492,597

(22) Filed: Oct. 23, 2023

(65) Prior Publication Data

US 2024/0056063 A1   Feb. 15, 2024

Related U.S. Application Data

(63) Continuation of application No. 17/822,375, filed on Aug. 25, 2022, now Pat. No. 11,838,025.

(30) Foreign Application Priority Data

Aug. 26, 2021  (FR) ..................................... 2108930

(51) Int. Cl.
*H03K 5/00* (2006.01)
(52) U.S. Cl.
CPC .............................. *H03K 5/00006* (2013.01)
(58) Field of Classification Search
CPC ... H03K 5/00006; H03B 5/1228; H02M 5/45; H03F 3/45659; H03F 1/3211; H03F 3/4565; H03F 1/0205; H03F 3/45179; H03F 3/45834; H03F 3/45686; H03F 3/45668; H03F 3/45816; H03F 3/4552;
(Continued)

(56) References Cited

U.S. PATENT DOCUMENTS 6,664,824 B2   12/2003  Laws
7,019,565 B2    3/2006  Tam et al.
(Continued)

FOREIGN PATENT DOCUMENTS

FR        2828350 A1      2/2003

OTHER PUBLICATIONS

Ghouchani, S., et al., "A Wideband Millimeter-Wave Frequency Doubler-Tripler in 0.13-μm CMOS," Department of Electrical and Computer Engineering, Carnegie Mellon University, Pittsburgh, PA, Published at RFIC 2010, May 23, 2010, 4 pages.

*Primary Examiner* — John W Poos
(74) *Attorney, Agent, or Firm* — Slater Matsil, LLP

(57) ABSTRACT

In an embodiment a radiofrequency doubler includes a first transistor and a second transistor connected in parallel between a first differential output and a first terminal of a current source configured to provide a bias current, a second terminal of the current source being connected to a first supply potential, a third transistor connected between the first terminal of the current source and a second differential output, a circuit configured to apply an AC component of a first differential input and a first DC voltage to a gate of the first transistor, apply an AC component of a second differential input and the first DC voltage to a gate of the second transistor and apply a second DC voltage to a gate of the third transistor, and a feedback loop configured to control the first voltage or the second voltage from a difference between DC components of the first and second differential outputs so as to equalize the DC components.

20 Claims, 3 Drawing Sheets

(58) Field of Classification Search
CPC ............. H03F 3/45654; H03F 3/45645; H03F 3/45497; H03F 3/45793; H03F 3/45538; H03F 3/45798; H03F 3/45506; H03F 3/45502; H03F 3/45511; H03F 3/45529; H03F 3/45672; H03F 3/45802; H03F 3/45475

See application file for complete search history.

(56) References Cited

U.S. PATENT DOCUMENTS

| | | |
|---|---|---|
| 10,855,225 B1 | 12/2020 | Taghivand et al. |
| 2003/0025537 A1* | 2/2003 | Laws ................ H03B 19/14 327/122 |
| 2004/0198297 A1* | 10/2004 | Oh .................. H03K 5/00006 455/313 |
| 2005/0093588 A1* | 5/2005 | Tam ..................... H02M 5/27 327/122 |
| 2006/0152257 A1* | 7/2006 | Yamamoto ............ H03B 19/14 327/116 |
| 2009/0160502 A1 | 6/2009 | Lu et al. |
| 2017/0141763 A1* | 5/2017 | Moon ............... H03K 5/00006 |

\* cited by examiner

RADIO FREQUENCY DOUBLER

CROSS-REFERENCE TO RELATED APPLICATIONS

This application is a Continuation Application of U.S. application Ser. No. 17/822,375, filed Aug. 25, 2022, which claims the benefit of French Application No. 2108930, filed on Aug. 26, 2021, which application is hereby incorporated herein by reference.

TECHNICAL FIELD

The present disclosure relates generally to electronic circuits, and more particularly to a doubler and a tripler of a radiofrequency signal.

BACKGROUND

A radiofrequency doubler, respectively a radiofrequency tripler, is a circuit configured to receive an input radiofrequency signal and to provide an output signal whose frequency is equal to two times, respectively three times, the frequency of the input signal. For example, the frequency of the input signal is greater than or equal to 1 GHz, or greater than or equal to 10 GHz, or greater than or equal to 20 GHz.

Known radiofrequency doublers and radiofrequency triplers have various drawbacks.

SUMMARY

Embodiments provide a radiofrequency doubler or a radiofrequency tripler.

Various embodiments address or overcome at least some of the drawbacks of known radiofrequency doublers and triplers.

One embodiment provides for a radiofrequency doubler comprising:
 a first transistor and a second transistor connected in parallel between a first differential output and a first terminal of a current source configured to provide a bias current, a second terminal of the current source being connected to a supply potential, preferably ground;
 a third transistor connected between the first terminal of the current source and a second differential output;
 a circuit configured to:
 apply an AC (alternating current) component of a first differential input and a first DC (direct current) voltage to the gate of the first transistor,
 apply an AC component of a second differential input and the first DC voltage to the gate of the second transistor, and
 apply a second DC voltage to the gate of the third transistor; and
 a feedback loop configured to control the first voltage or the second voltage from a difference between the DC components of the first and second differential outputs so as to equalize the DC components.

According to one embodiment, the feedback loop is configured to provide an output voltage representative of said difference.

According to one embodiment, the feedback loop comprises a first input coupled, for example, connected, to the first differential output, a second input coupled, for example, connected, to the second differential output, and an output configured to provide said output voltage.

According to one embodiment, the feedback loop comprises:
 an operational amplifier;
 a capacitor connected between a non-inverting input of the amplifier and said supply potential;
 a capacitor connected between an inverting input of the amplifier and an output of the amplifier; and
 a first resistor coupling the non-inverting input to the first input of the feedback loop when the first voltage is controlled by the feedback loop, or to the second input of the feedback loop when the second voltage is controlled by the feedback loop; and
 a second resistor coupling the inverting input to the second input of the feedback loop when the first voltage is controlled by the feedback loop, or to the second input of the feedback loop when the second voltage is controlled by the feedback loop.

According to one embodiment, the circuit is configured to provide the first voltage from the output voltage of the feedback loop when the first voltage is controlled by the feedback loop, or to provide the second voltage from the output voltage of the feedback loop when the second voltage is controlled by the feedback loop.

According to one embodiment, the circuit is configured to receive the output voltage of the feedback loop.

According to one embodiment, said circuit comprises an output connected to the gate of the third transistor, said output being configured to provide the output voltage of the feedback loop when the second voltage is controlled by the feedback loop or a constant bias voltage when the first voltage is controlled by the feedback loop.

According to one embodiment, the circuit comprises:
 a first capacitor coupling the first differential input to the gate of the first transistor;
 a second capacitor coupling the second differential input to the gate of the second transistor;
 a first resistor coupling the gate of the first transistor to a first node configured to receive the output voltage of the feedback loop when the first voltage is controlled by said loop or the bias voltage when the second voltage is controlled by said loop;
 a second resistor coupling the gate of the second transistor to the first node; and
 a third capacitor coupling the first node to said supply potential.

According to one embodiment, the circuit comprises a transformer having its primary coupled to the first and second differential inputs, and its secondary coupled to the gates of the first and second transistors, the secondary being configured to be biased by the output voltage of the feedback loop when the first voltage is controlled by said loop or by the bias voltage when the second voltage is controlled by said loop.

According to one embodiment, the circuit comprises a fourth capacitor coupling said output of the circuit to the supply potential.

Another embodiment provides a radiofrequency tripler comprising:
 a radiofrequency doubler as described; and
 a radiofrequency mixer configured to mix a first radiofrequency signal and a second radiofrequency signal, the radiofrequency mixer comprising a first pair of differential inputs configured to receive the first signal and a second pair of differential inputs configured to receive the second signal,
 wherein the first pair of differential inputs is connected to the first and second differential inputs of the radiofrequency doubler, and the second pair of differential inputs is connected to the first and second differential outputs of the radiofrequency doubler.

According to one embodiment, the radiofrequency mixer comprises:

a first transistor connected between a first input of the second pair of inputs and a first differential output of the radiofrequency tripler;

a second transistor connected between the first input of the second pair of inputs and a second differential output of the radiofrequency tripler;

a third transistor connected between a second input of the second pair of inputs and the first output of the radiofrequency tripler; and a fourth transistor connected between the second input of the second pair of inputs and the second output of the radiofrequency tripler.

According to one embodiment:

a first input of the first pair of differential inputs is coupled, for example, connected, to the gate of said first transistor and to the gate of said fourth transistor; and a second input of the first pair of differential inputs is coupled, for example connected to the gate of said second transistor and to the gate of said third transistor.

According to one embodiment, the mixer comprises a differential load coupled between the first and second differential outputs of the radiofrequency tripler and tuned to a frequency equal to three times a frequency of the first radiofrequency signal, the differential load comprising, for example:

a capacitor connected between the first and second differential outputs of the radiofrequency tripler;

a first inductor connected between the first differential output of the radiofrequency tripler and a node configured to receive a supply potential; and a second inductor connected between the second differential output of the radiofrequency tripler and said node.

Another embodiment provides for a radiofrequency transmission and/or reception chain comprising a radiofrequency doubler or a radiofrequency tripler as described.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may dispose identical structural, dimensional, and material properties.

For the sake of clarity, only the operations and elements that are useful for an understanding of the embodiments described herein have been illustrated and described in detail. In particular, the various usual circuits comprising a radiofrequency doubler or a radiofrequency tripler have not been detailed, as the described embodiments are compatible with these usual circuits.

Unless indicated otherwise, when reference is made to two elements connected together, this signifies a direct connection without any intermediate elements other than conductors, and when reference is made to two elements coupled together, this signifies that these two elements can be connected, or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures, as orientated during normal use.

Unless specified otherwise, the expressions "around", "approximately", "substantially" and "in the order of" signify within 10%, and preferably within 5%.

Figure 1:
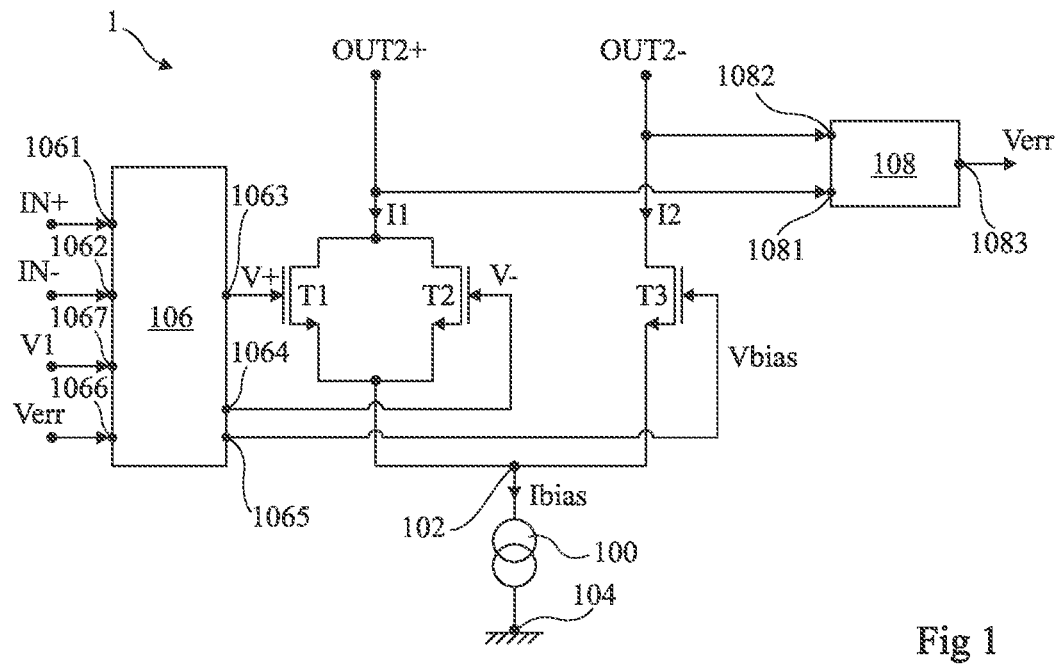
FIG. 1 shows, schematically and in block form, one embodiment of a radiofrequency doubler.

FIG. 1 shows, schematically and at least partially in block form, one embodiment of a radiofrequency doubler 1.

The radiofrequency doubler 1 is configured to receive a differential radiofrequency signal at a first frequency F1, and to provide a differential radiofrequency signal at a second frequency F2 equal to twice the first frequency. In other words, the radiofrequency doubler is configured to double the frequency F1 of a differential radiofrequency signal.

The radiofrequency doubler 1 comprises a pair of differential inputs IN+ and IN−. The input IN+ is configured to receive a radiofrequency signal, with the input IN− configured to receive a radiofrequency signal corresponding to the radiofrequency signal received by the input IN+ phase shifted by 180°. The pair of inputs IN+ and IN− is configured to receive a differential input radiofrequency signal of the frequency F1 which is to be doubled.

The radiofrequency doubler 1 comprises a pair of differential outputs OUT2+ and OUT2−. The output OUT2+ is configured to provide a radiofrequency signal at the frequency F2 equal to twice the frequency F1 of the signal received by the pair of inputs IN+ and IN−. The output OUT2− is configured to provide a radiofrequency signal corresponding to the signal on the output OUT2+ shifted in phase by 180°. In other words, the output OUT2+ and OUT2− pair is configured to provide a differential output radiofrequency signal at the frequency F2.

The outputs OUT2+ and OUT2− are intended to be connected to a load such that the impedance seen by the radiofrequency doubler 1 at its output OUT2+ is equal to the impedance seen by the radiofrequency doubler 1 at its output OUT2−, as is customary for differential signal transmissions.

The radiofrequency doubler 1 comprises a current source 100. The current source 100 is configured to provide a bias current Ibias. The current Ibias is constant. The current source 100 comprises a first terminal 102 and a second terminal 104, the terminal 104 being coupled, for example connected, to a supply potential, in this example the ground.

In other words, the terminal 104 is coupled, for example connected to a node 106 configured to receive that supply potential.

The radiofrequency doubler 1 comprises a metal oxide semiconductor (MOS) transistor T1, and a MOS transistor T2. In this example, the transistors T1 and T2 are N-channel. Preferably, the transistors T1 and T2 are identical.

The transistors T1 and T2 are connected in parallel between the terminal 102 of the current source 100 and one of the outputs OUT2+ and OUT2−, in this example the output OUT2+.

The transistors T1 and T2 are configured to be driven in anti-phase from inputs IN+ and IN−. More particularly, the gate of the transistor T1 is configured to receive a voltage V+, with the gate of the transistor T2 being configured to receive a voltage V−. The voltage V+ is obtained from the input IN+, the voltage V− being obtained from the input IN−. The voltages V+ and V− are in phase opposition, and at the frequency F1. As an example, the circuit 106 comprises an input 1061 connected to the input IN+, an input 1062 connected to the input IN−, an output 1063 configured to provide the voltage V+, an output 1064 configured to provide the voltage V−, and an output 1065 configured to provide the voltage Vbias.

The radiofrequency doubler 1 comprises a MOS transistor T3. The transistor T3 is of a channel of the same type as the transistors T1 and T2, namely N channel in this example. Preferably, the transistor T3 is identical to the transistors T1 and T2.

The transistor T3 is configured to be controlled by a DC voltage Vbias.

The radiofrequency doubler 1 comprises a circuit 106 configured to provide the voltages V+, V− and Vbias.

More particularly, the circuit 106 is configured so that the voltage V+ is equal to the alternating current (AC) component of the signal, or voltage, received at the input IN+ plus a direct current (DC) voltage VDC, and that the voltage V− is equal to the alternating current (AC) component of the signal, or voltage, received at the input IN− plus the voltage VDC. In other words, the circuit 106 is configured to couple the input IN+, respectively IN−, to the gate of the transistor T1, respectively T2, such that only the AC component of the voltage IN+, respectively IN−, is transmitted to the gate of the transistor T1, respectively T2, and, further, to simultaneously apply to the gates of the transistors T1 and T2 the DC component VDC.

It is proposed here to control, or determine, the voltage VDC or the voltage Vbias from a difference, or deviation, between the DC component on the output OUT2+ and the DC component on the output OUT2−, so that the DC component on the output OUT2+ is equal to the DC component on the output OUT2−, or, in other words, the DC current in the branch comprising the transistors T1 and T2 is equal to the DC current in the branch comprising the transistor T3.

More particularly, according to one embodiment, the voltage VDC, i.e., the DC component of the voltages V+ and V−, is controlled from the difference between the DC components of the outputs OUT2+ and OUT2−. In this embodiment, the voltage Vbias is constant. As an example, the voltage Vbias is then determined by a constant DC bias voltage V1. For example, the voltage Vbias is then equal to the voltage V1.

According to another embodiment, the voltage Vbias is controlled from the difference between the DC components of the outputs OUT2+ and OUT2−. For example, the voltage Vbias is then equal to the voltage Verr. In this embodiment, the voltage VDC, i.e., the DC component of the voltages V+ and V−, is constant. As an example, the voltage VDC is then determined by the voltage V1.

In order to implement this servo control, the radiofrequency doubler 1 comprises a feedback loop 108. The feedback loop 108 is configured to determine, or control, the voltage VDC or the voltage Vbias so as to equalize the DC components of the outputs OUT2+ and OUT2−.

According to one embodiment, the feedback loop 108 is configured to provide an output voltage Verr of the feedback loop 108. The voltage Verr is representative of the difference between the DC components of the outputs OUT2+ and OUT2−. In other words, the value of the voltage Verr varies with the difference in value between the DC components of the outputs OUT2+ and OUT2−. In other words, the value of the difference between the DC components of outputs OUT2+ and OUT2− determines the value of the voltage Verr. More particularly, the feedback loop 108 comprises, for example, an input 1081 coupled, preferably connected, to the output OUT2+, an input 1082 coupled, preferably connected, to the output OUT2−, and an output 1083 configured to provide the voltage Verr.

According to one embodiment, the circuit 106 is configured to provide the voltage VDC, i.e., the DC component of the voltages V+ and V−, from the voltage Verr. As an example, in one such embodiment, the circuit 106 is configured to provide the constant voltage Vbias from the voltage V1, for example such that the voltage Vbias is equal to the voltage V1.

According to another embodiment, the circuit 106 is configured to provide the voltage Vbias from the voltage Verr, for example such that the voltage Vbias is equal to the voltage Verr. As an example, in one such embodiment, the circuit 106 is configured to provide the constant voltage VDC from the voltage V1. In other words, the circuit 106 is configured to provide the constant voltage VDC determined, or set, by the constant voltage V1.

The circuit 106 is thus configured to receive the voltage Verr. As an example, the circuit 106 presents an input 1066 configured to receive the voltage Verr. The input 106 is coupled, preferably connected, to the output 1083 of the feedback loop 108. Preferably, the circuit 106 is further configured to receive the voltage V1, for example, at an input 1067 of the circuit 106.

As previously discussed, the circuit 106 is configured to couple the input IN+, respectively IN−, to the gate of the transistor T1, respectively T2, such that only the AC component of the voltage IN+, respectively IN−, is transmitted to the gate of the transistor T1, respectively T2. In other words, the circuit 106 is configured to couple its input 1061, respectively 1062, to its output 1063, respectively 1064, by implementing a filtering of the DC component, or DC filtering, between the input 1061 and the output 1063, respectively between the input 1062 and the output 1064.

To describe the operation of the radiofrequency doubler 1, it is considered, by way of example, the embodiment in which the voltage VDC is controlled from the voltage Verr, and in which the voltage Vbias is fixed and, for example, equal to the voltage V1.

In the radiofrequency doubler 1, in the branch comprising the transistors T1 and T2, the transistors T1 and T2 are controlled by the voltages V+ and V− which are in phase opposition to each other, and which have the same DC component VDC. Thus, as soon as the voltages V+ and V− have sufficient amplitude to exploit the non-linear, so-called "large signal" operation of transistors T1 and T2, for example amplitudes of the order of several hundred millivolts, a current I1 in the branch comprising the transistors T1 and T2 has a component at a frequency equal to F2. Furthermore, the sum of the current I1 in the branch comprising the transistors T1 and T2 and the current I2 in the branch comprising the transistor T3 is equal to the constant current Ibias. Thus, the current I2 is in phase opposition to the current I1, and also has a component at the same frequency F2 as the current I1.

It is further considered, for example, that the DC voltage component on the output OUT2+ is less than the DC voltage component on the output OUT2−. In other words, the average value, i.e., the DC component, of the current I1 is greater than the average value, i.e., the DC component, of the current I2, for example, due to the non-linear operation of the transistors T1 and T2. Put another way, it is considered that the outputs OUT2+ and OUT2− are unbalanced. This imbalance is reflected in a corresponding change, for example, a drop, in the value of the voltage Verr relative to the value of the voltage Verr when the outputs OUT2+ and OUT2− are balanced. The VDC component of the voltages V+ and V−, which is controlled by the feedback loop 108, and thus by the voltage Verr, is then modified, for example reduced in the example shown in FIG. 1, as a result of the drop in the voltage Verr. As a result, the average value of the current I1 drops, until it becomes equal to the average value of the current I2 again, i.e., until the outputs OUT2+ and OUT2− balance. As the average value of current I1 approaches that of the current I2, the voltage value Verr stabilizes.

The operation of the frequency doubler 1 has been described above when the imbalance between the outputs OUT2+ and OUT2− corresponds to the case where the DC voltage component on the output OUT2+ is greater than that on the output OUT2−, and the voltage VDC is controlled by the feedback loop 108. The person skilled in the art is able to deduce from this description that the operation of the radiofrequency doubler 1 when the imbalance between the outputs OUT2+ and OUT2− corresponds to the case where the DC voltage component on the output OUT2+ is lower than that on the output OUT2−, and/or the voltage Vbias is controlled by the feedback loop 108 while the DC voltage component VDC of the voltages V+ and V− is fixed, for example by the voltage V1.

The radiofrequency doubler 1 thus makes it possible to obtain balanced outputs OUT2+ and OUT2−. This advantageously makes it possible to maximize the component amplitude at the desired frequency F2, while balancing the outputs OUT2+ and OUT2−.

The radiofrequency doubler 1 makes it possible to obtain this balance of the outputs OUT2+ and OUT2− without having to use four control signals having the same frequency F1 as the signal on the inputs IN+ and IN− and presenting phase shifts relative to the signal on the inputs IN+ and IN− equal to 0°, 90°, 180° and 270° respectively, which would have necessitated the provision of a cumbersome polyphase filter introducing losses at the frequencies considered.

The radiofrequency doubler 1 makes it possible to obtain a component at the frequency F2 which is double the frequency F1, without having to use a Phase Locked Loop (PLL) either, as the implementation of such a PLL is complex, if not impossible, at the frequencies considered.

The radiofrequency doubler 1 makes it possible to obtain a component at the frequency F2 that is double the frequency F1 without using an injection-locked oscillator, which has a very narrow locking range and can easily be unlocked at the frequencies under consideration.

More generally, compared to usual radiofrequency doublers, the radiofrequency doubler 1 is particularly simple and unobtrusive to implement.

Figure 2:
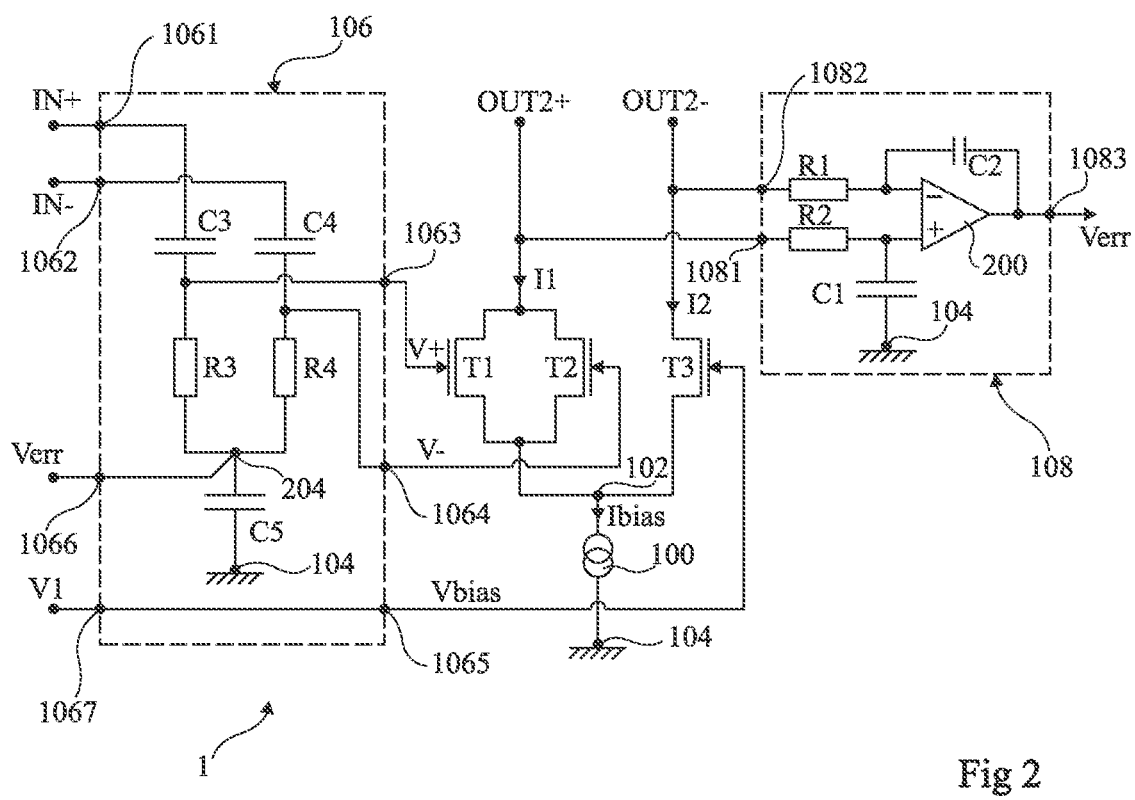
FIG. 2 shows, in greater detail, an example of one embodiment of the radiofrequency doubler of FIG. 1.

FIG. 2 shows, in greater detail, an example of an embodiment of the radiofrequency doubler 1. In FIG. 2, the radiofrequency doubler 1 is implemented according to one embodiment in which the direct current (DC) component VDC of the voltages V+ and V− is controlled by the phase loop 108, the voltage Vbias then being constant and, in this example, equal to the bias voltage V1.

More particularly, in FIG. 2, an example of one embodiment of the feedback loop 108 is detailed and one embodiment of the circuit 106 is detailed, the remainder of the radiofrequency doubler 1 being identical to what has been described in connection with FIG. 1. Furthermore, it will be noted that the manner in which the feedback loop 108 is implemented is independent of the manner in which the circuit 106 is implemented, since the circuit 106 is configured to provide the DC component VDC of the voltages V+ and V− from the voltage Verr so as to implement the previously described operation of the radiofrequency doubler 1.

In FIG. 2, the feedback loop 108 is implemented by a differential integrator.

More particularly, in FIG. 2, the feedback loop 108 comprises an operational amplifier 200. A capacitor C1 is connected between a non-inverting input (+) of the amplifier 108 and the supply potential of the node 104, namely ground in the example of FIG. 2. In other words, the capacitor C1 is connected between the non-inverting input and the node 104. A capacitor C2 is connected between an inverting input (−) of the amplifier 200 and an output of the amplifier. The output of the amplifier 200 is configured to provide the voltage Verr. For example, the output of the amplifier 200 is connected to the output 1083 of the feedback loop.

Furthermore, in FIG. 2, the feedback loop 108 comprises resistors R1 and R2 coupling the inputs of the amplifier 200 to the inputs 1081 and 1082 of the feedback loop. In this embodiment where the voltage VDC is determined by the feedback loop 108, the resistor R1 couples the inverting input to the input 1082 and the resistor R2 couples the non-inverting input to the input 1081. For example, the resistor R1 has one terminal connected to the inverting input of the amplifier 200 and another terminal connected to the input 1082 of the feedback loop, the resistor R2 having one terminal connected to the non-inverting input of the amplifier 200 and another terminal connected to the input 1081 of the feedback loop.

Furthermore, in FIG. 2, the circuit 106 comprises a capacitor C3 coupling the differential input IN+ to the gate of the transistor T1, and a capacitor C4 coupling the differential input IN− to the gate of the transistor T2. For example, capacitor C3 is connected between the input 1061 and the output 1063 of the circuit 106, with the capacitor C4 connected between the input 1062 and the output 1064 of the circuit 106. The capacitor C3, respectively C4, is configured to filter the DC component between the input 1061 and the output 1063 of the circuit 106, respectively between the input 1062 and the output 1064 of the circuit 106. Preferably, the capacitors C3 and C4 have the same capacitance value.

In FIG. 2, the circuit 106 further comprises, a resistor R3 coupling the gate of the transistor T1, i.e., the output 1063 of the circuit 106, to a node 204, and a resistor R4 coupling the gate of the transistor T2, i.e., the output 1064 of the circuit 106, to the node 204. For example, the resistor R3, respectively R4, has one terminal connected to the gate of the transistor T1, respectively T2, and another terminal connected to the node 204. A capacitor C5 couples the node 204 to the supply potential of node 104. For example, the capacitor C5 is connected between nodes 104 and 204.

In this embodiment where the voltage VDC is controlled by the feedback loop 108, the node 204 is configured to receive the output voltage Verr from the feedback loop 108, the node 108 being connected to the output 1083 of the feedback loop 108, for example. Thus, as the voltage Verr changes, it causes a corresponding change in the DC (direct current) component VDC of the voltages V+ and V−. Furthermore, in this embodiment, the output 1065 of the circuit 106 is configured so that the voltage Vbias it provides is equal to the voltage V1. In other words, the output 1065 of the circuit 106 is configured to receive the voltage V1 and provide the voltage Vbias. As an example, the input 1067 of the circuit 106 is then connected to the output 1065 of the circuit 106.

Figure 3:
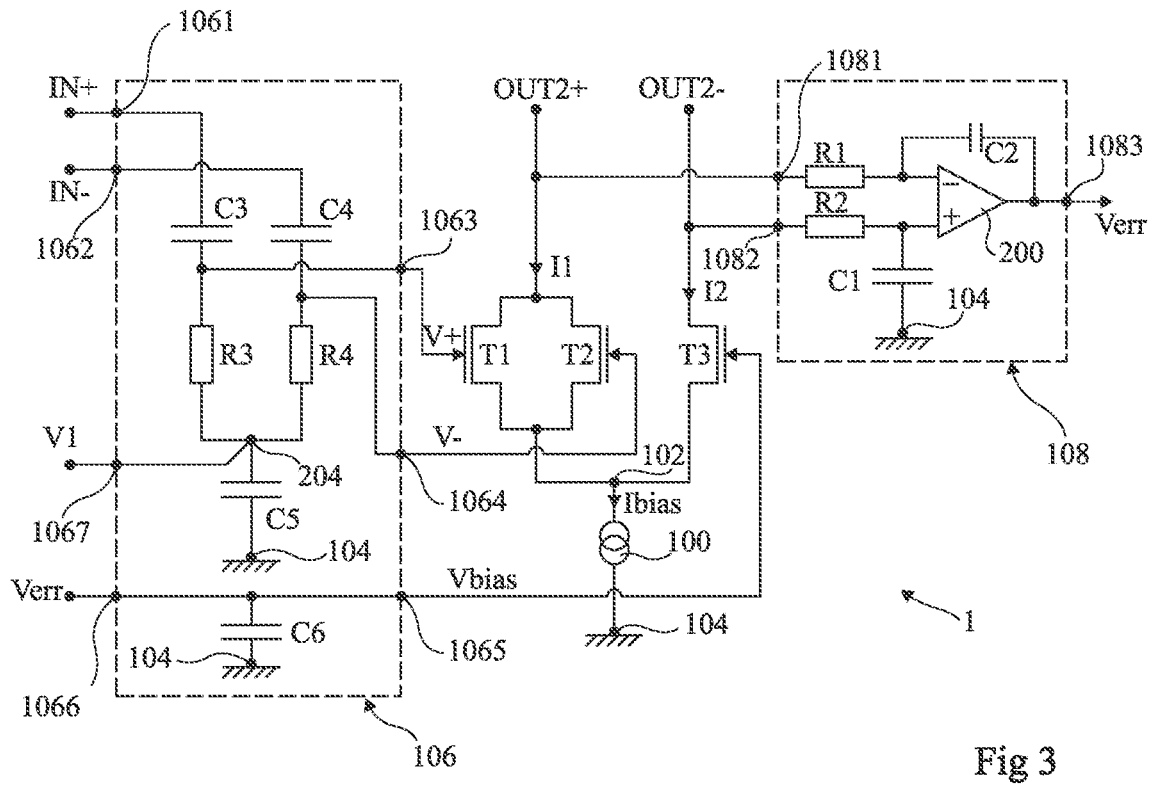
FIG. 3 shows, in greater detail, another example of one embodiment of the radiofrequency doubler of FIG. 1.

FIG. 3 shows, in more detail, another example of one embodiment of the radiofrequency doubler of FIG. 1. In FIG. 3, the radiofrequency doubler 1 is implemented according to one embodiment in which the voltage Vbias is controlled by the feedback loop 108, the DC component VDC of the voltages V+ and V− then being constant and, in this example, set by the bias voltage V1. In the example shown in FIG. 3, the voltage Vbias is equal to the voltage Verr.

More particularly, in FIG. 3, an example of one embodiment of the feedback loop 108 is detailed, one embodiment of the circuit 106 is detailed, the remainder of the radiofrequency doubler 1 being identical to what has been described in connection with FIG. 1. Furthermore, it will be noted that the manner in which the feedback loop 108 is implemented is independent of the manner in which the circuit 106 is implemented, since the circuit 106 is configured to provide the voltage Vbias from the voltage Verr so as to implement the operation previously described relative to FIG. 1.

The radiofrequency doubler 1 of FIG. 3 comprises many elements in common with that of FIG. 2, and only the differences between these two figures are highlighted here.

Unlike FIG. 2, in the embodiment of FIG. 3 where the voltage Vbias is controlled by the feedback loop 108, the resistor R1 couples the inverting input of the amplifier 200 to the input 1081 of the feedback loop 106, and the resistor R2 couples the non-inverting input of the amplifier 200 to the input 1082 of the feedback loop 106. As an example, the resistor R1 presents one terminal connected to the inverting input of the amplifier 200 and another terminal connected to the input 1081 of the feedback loop, the resistor R2 having one terminal connected to the non-inverting input of the amplifier 200 and another terminal connected to the input 1082 of the feedback loop.

Furthermore, in this embodiment where the voltage Vbias is controlled by the feedback loop 108, the node 204 is configured to receive the voltage V1, and the output 1065 of the circuit 106 is configured so that the voltage Vbias it provides is equal to the voltage Verr. Thus, when the Verr voltage changes, it causes a corresponding change in the Vbias. In other words, the output 1065 of the circuit 106 is configured to receive the voltage Verr and provide the voltage Vbias. As an example, the input 1066 of the circuit 106 is then connected to the output 1065 of the circuit 106. Preferably, in this embodiment, a capacitor C6 couples the output 1065 of the circuit 106 to the potential of the node 104, with the capacitor C6 being, for example, connected between the output 1065 and the node 104.

Although particular embodiments of the circuit 106 have been described above in connection with FIGS. 2 and 3, the person skilled in the art is able to foresee other implementations of this circuit from the functional description of this circuit 106 made relative to FIG. 1. For example, according to another embodiment not shown, the circuit 106 comprises a transformer having its primary coupled to the differential inputs IN+ and IN−, and its secondary coupled to the gates of the transistors T1 and T2. In one embodiment where the DC (direct current) component VDC of the voltages V+ and V− is controlled by the feedback loop 108, the secondary of the transformer is then configured to be biased by the voltage Verr. In another embodiment where the voltage Vbias is controlled by the feedback loop 108, the secondary of the transformer is then configured to be biased by the voltage V1.

Furthermore, although particular embodiments of the feedback loop 108 have been described above related to FIGS. 2 and 3 in which the feedback loop 108 is implemented from a differential integrator, the person skilled in the art is able to foresee other implementations of this feedback loop 108 from the functional description of this feedback loop 108 made relative to FIG. 1. For example, according to another embodiment not shown, the feedback loop 108 is implemented using an error amplifier.

Because the radiofrequency doubler 1 described relative to FIG. 1, FIG. 2, or FIG. 3 has its differential outputs OUT2+ and OUT2− balanced by the feedback loop 108, the radiofrequency doubler 1 is, for example, suitable for use in a radiofrequency tripler, although the radiofrequency doubler 1 may also be used alone. For example, when the radiofrequency doubler 1 is used alone, i.e., to provide a component at frequency F2, then its outputs OUT2+ and OUT2− are coupled to a differential load matched, or tuned, to the frequency F2 as is customary in the art.

Figure 4:
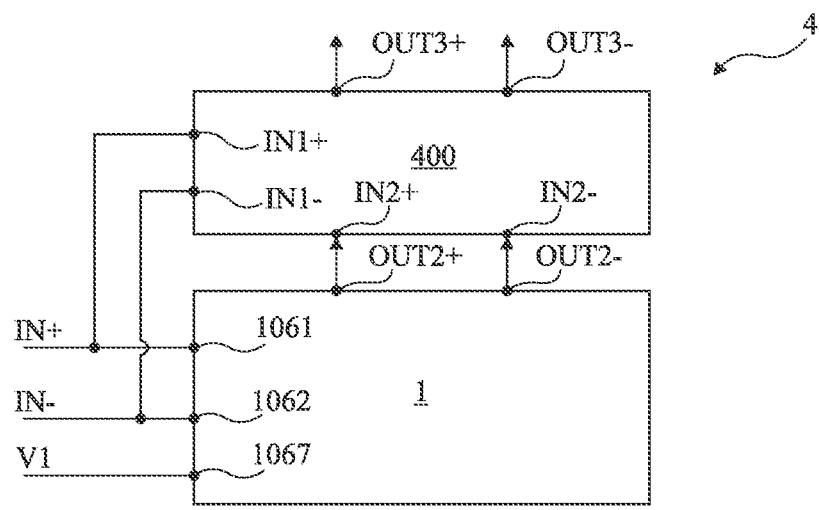
FIG. 4 shows, schematically and in block form, one embodiment of a radiofrequency tripler.

FIG. 4 shows, schematically and in block form, one embodiment of such a radiofrequency tripler 4. In particular, in FIG. 4, the radiofrequency doubler 1 is shown in block form comprising the inputs 1061, 1062, and in this example 1067, and further comprising the differential output pair OUT2+ and OUT2−.

In addition to the radiofrequency doubler 1, the radiofrequency tripler 4 comprises a radiofrequency mixer 400, also referred to as a radiofrequency multiplier 400. The frequency mixer 400 is configured to mix (multiply) a first radiofrequency signal and a second radiofrequency signal. The output signal of the mixer 400 is a multiplication of the first and second signals. Thus, the frequency of the output signal of the mixer is equal to the sum of the frequency of the first signal and the frequency of the second signal.

More particularly, the mixer 400 comprises a first pair of differential inputs IN1+ and IN1− configured to receive the first signal, in this case a first differential signal, and a second pair of differential inputs IN2+ and IN2− configured to receive the second signal−, in this case a second differential signal. The mixer 400 further comprises a pair of differential outputs OUT3+ and OUT3− at which the differential output signal from the mixer is available, the signal at the OUT3− output being 180° out of phase relative to the signal at the OUT3+ output.

In FIG. 4, the pair of differential inputs IN1+ and IN1− is connected to the respective differential inputs IN+ and IN− of the radiofrequency doubler 1, and the pair of differential inputs IN2+ and IN2− is connected to the respective differential outputs OUT2+ and OUT2− of the radiofrequency doubler 1. Thus, the output signal from the mixer 400 is at a frequency F3 equal to the sum of the frequency F1 of the signal on the inputs IN+ and IN− and the frequency F2 of the signal on the outputs OUT2+ and OUT2− of the radiofrequency doubler 1. In other words, the output signal of the mixer is at the frequency F3 which is equal to three times the frequency F1 of the signal on the inputs IN+ and IN−.

It is an advantage that the radiofrequency doubler 1 is balanced, i.e., the outputs OUT2+ and OUT2− of the radiofrequency doubler 1 are balanced, and that the power losses in the frequency tripler 4 are limited, especially at frequency F3. In addition, another advantage of having the radiofrequency doubler 1 balanced is that, in the output signal of the radiofrequency tripler 4, the ratio of the power related to the frequency F3 to the power related to the frequency F1 is greater than in the case where the radiofrequency doubler 1 would be replaced by a usual imbalanced radiofrequency doubler.

The radiofrequency tripler 4 of FIG. 4 is simple and unobtrusive to implement compared to usual imbalanced radiofrequency triplers.

Figure 5:
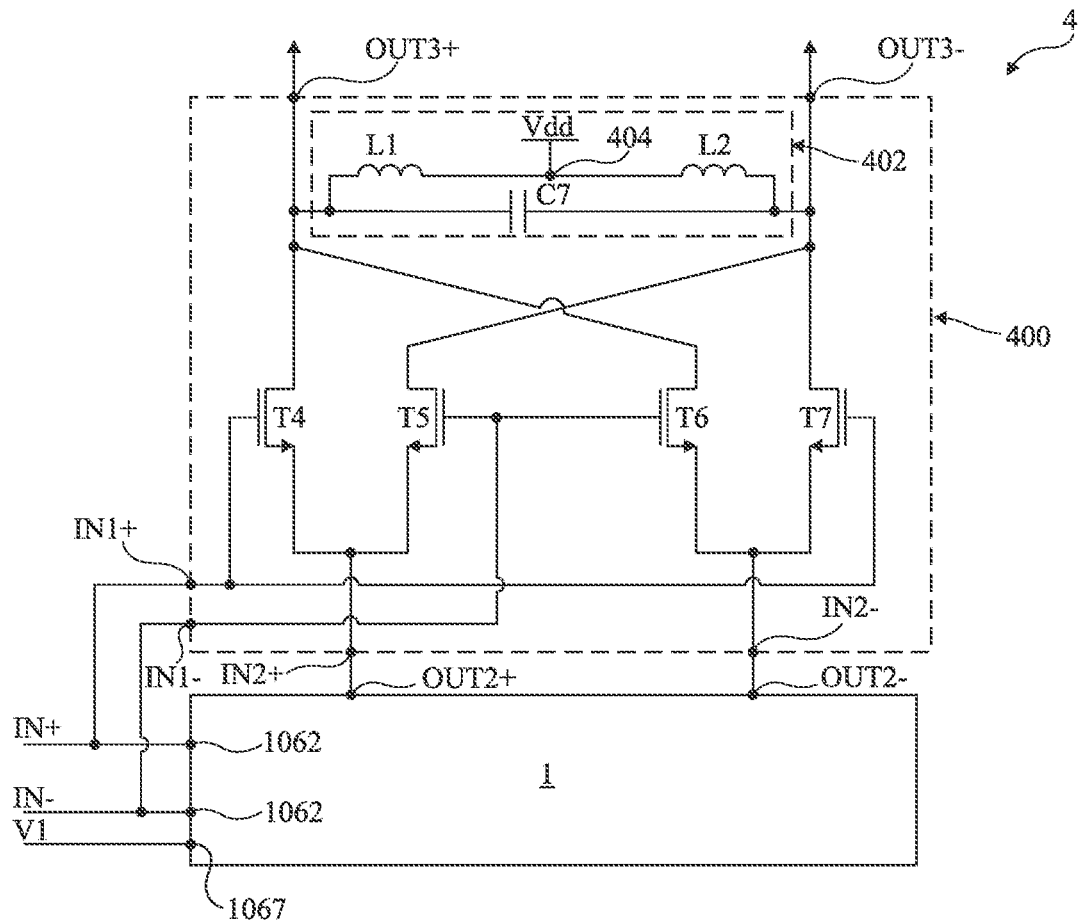
FIG. 5 shows, in greater detail, an example of one embodiment of the radiofrequency tripler of FIG. 5.

FIG. 5 shows, in more detail, an example of one embodiment of the radiofrequency tripler 4 of FIG. 5. In particular, FIG. 5 shows in greater detail an example of the embodiment of the mixer 400.

In FIG. 5, the mixer 400 comprises a MOS transistor T4 connected between the input IN2+ of the differential input pair IN2+ and IN2− and the output OUT3+ of the radiofrequency tripler 4. For example, the transistor T4 has a first conduction terminal, for example its source, connected to the input IN2+, and a second conduction terminal, for example its drain, connected to the output OUT3+. The mixer 400 further comprises a transistor T5 connected between the input IN2+ of the differential input pair IN2+ and IN2− and the output OUT3− of the radiofrequency tripler 4. As an example, the transistor T5 has a first conduction terminal, for example its source, connected to the input IN2+, and a second conduction terminal, for example its drain, connected to the output OUT3−. The mixer 400 also comprises a MOS transistor T6 connected between the input IN2− of the differential input pair IN2+ and IN2− and the output OUT3+ of the radiofrequency tripler 4. As an example, the transistor T6 has a first conduction terminal, for example, its source, connected to the input IN2−, and a second conduction terminal, for example, its drain, connected to the output OUT3+. Finally, the mixer 400 comprises a MOS transistor T7 connected between the input IN2− of the differential input pair IN2+ and IN2− and the output OUT3− of the radiofrequency tripler 4. As an example, the transistor T7 has a first conduction terminal, for example its source, connected to the input IN2−, and a second conduction terminal, for example its drain, connected to output OUT3−. As an example, in this embodiment where node 104 (FIG. 1) is configured to receive the ground potential, transistors T4, T5, T6 and T7 are N-channel. Preferably, transistors T4, T5, T6 and T7 are identical.

The transistors T4 and T5 are controlled in phase opposition from the signal on the differential inputs IN1+ and IN1−. Symmetrically, the transistors T6 and T7 are controlled in phase opposition from the signal on the differential inputs IN1+ and IN1−. According to one embodiment, the input IN1+ of the first pair of differential inputs IN1+ and IN1− is coupled, for example, connected, to the gate of the transistor T4 and to the gate of the transistor T7, the input IN1− of the pair of differential inputs IN1+ and IN1− being coupled, for example, connected, to the gate of the transistor T5 and to the gate of the transistor T6.

According to one embodiment, the mixer 400 further comprises, between its outputs OU3+ and OUT3−, a differential load 402. Preferably, the differential load 402 is matched, or tuned, to the frequency F3, thereby maximizing the power of the differential output signal at that frequency F3 while attenuating, or filtering, the components of the differential output signal at other unwanted frequencies. The filtering effect naturally achieved by the differential load 402 tuned to frequency F3 is beneficial. However, balancing the outputs OUT2+ and OUT2− of the radiofrequency doubler 1 outputs reduces, or minimizes, the component at frequency F1 of the differential output signal of the doubler 1, and thus of the differential output signal of the tripler 4, thereby relaxing, or reducing, the need to filter this component F1 with the differential load 402.

According to one embodiment illustrated in FIG. 5, the differential load 402 is implemented by a tunable load. The tunable load 402 includes, for example, a capacitor C7 connected between the differential outputs OUT3+ and OUT3− of the radiofrequency tripler 4, an inductor L1 connected between the differential output OUT3+ of the radiofrequency tripler 4 and a node 404 configured to receive a supply potential Vdd different from that received by the node 104, for example positive with respect to ground, and an inductor L2 connected between the differential output OUT3− of the radiofrequency tripler 4 and the node 404.

The person skilled in the art is able to provide other implementations of the differential load 402. For example, according to one embodiment not shown, the differential load 402 is implemented by an impedance matching network. For example, according to another embodiment not shown, the differential load 402 is implemented by a transformer.

The previously described radiofrequency doubler 1 or radiofrequency tripler 4 may be used in a wide variety of radiofrequency circuits in which radiofrequency signals having frequencies of, for example, 40 GHz or more, or even 60 GHz, are used. This is for example the case in wireless radiofrequency signal receiving and/or transmitting chains, for example a transmitting and/or receiving chain conforming to the 5G standard.

Figure 6:
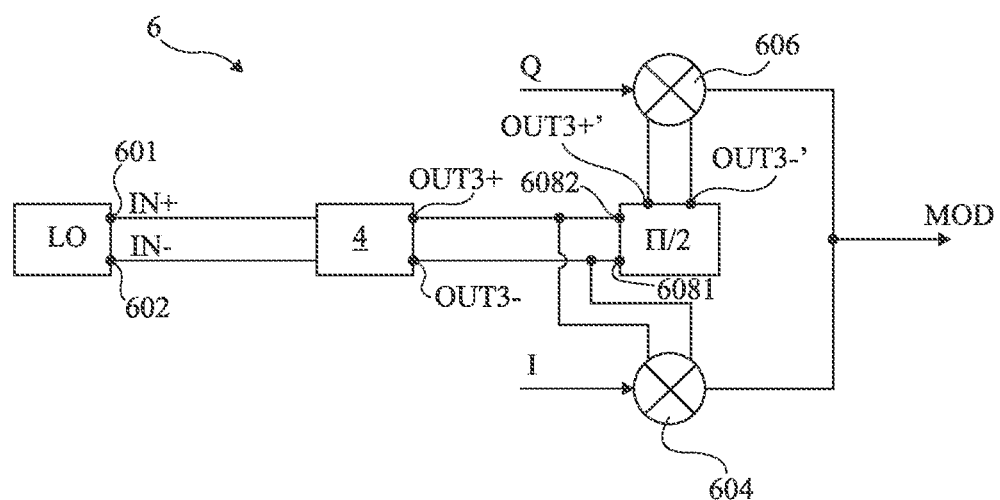
FIG. 6 shows, in a partial, schematic, and in block form, one embodiment of a radiofrequency transmission or reception chain.

FIG. 6 shows, schematically, partially and in block form, one embodiment of such a transmission chain 6.

The transmission chain 6 comprises a circuit LO configured to supply a differential radiofrequency signal at frequency F1. The circuit LO, or local oscillator, at its differential outputs 601 and 602 configured to provide this radiofrequency signal, which are connected to the respective differential inputs IN+ and IN− of the radiofrequency tripler 4. The radiofrequency tripler 4 provides, on its outputs OUT3+ and OUT3−, a differential radiofrequency signal at the frequency F3. This signal is, for example, supplied to a frequency mixer 604, without having undergone a phase shift, and to another frequency mixer 606 after having undergone a phase shift of 90°. More particularly, the transmission chain 6 comprises a circuit 608 (block "Π/2" in FIG. 6) configured to receive the output signal of the frequency tripler 4 and to provide, to the mixer 606, a signal corresponding to the output signal of the frequency tripler 4 shifted in phase by 90° with respect thereto. By way of example, the phase shifter 608 comprises an input 6081 connected to the output OUT3− of the radiofrequency tripler 4, an input 6082 connected to the output OUT3+ of the radiofrequency tripler 4, and two outputs OUT3+' and OUT3−' forming a differential output pair OUT3+' and OUT3−' of the circuit 608. The output signal from the circuit 608 is available at the outputs OUT3+' and OUT3−'. The outputs OUT3+' and OUT3−' are, for example, connected to corresponding differential inputs of the mixer 606.

The mixer 604 receives a binary control signal I and the mixer 606 receives a binary control signal Q. The signals I and Q are, for example, provided by a digital circuit not shown, and are representative of data to be transmitted via a wireless radiofrequency signal from the transmission chain 6.

The output signals from the mixers 604 and 606 are combined with each other to form a modulated radiofrequency signal MOD. This signal MOD is then transmitted using an antenna not shown.

Although the transmission chain 6 has been described in the case where it comprises the radiofrequency tripler 4, the implementation of the transmission chain 6 in the case where the radiofrequency tripler 4 is replaced by the radiofrequency doubler 1 is within the scope of the person skilled in the art.

Furthermore, although the case of a transmission chain has been described in relation to FIG. 6, the person skilled in the art is able to deduce from this description the implementation of a corresponding reception chain. For example, in such a reception chain, the signal MOD is received by the mixers 604 and 606, which then provide the signals I and Q. These signals I and Q are, for example, passed after shaping to a digital circuit configured to decode the signals I and Q, so as to obtain the data transmitted via the signal MOD to that receiving chain.

Embodiments have previously been described in which the supply potential received by the node 104 is the ground potential and the supply potential Vdd received by the node 404 described in connection with FIG. 5 is positive with respect to the ground potential. The person skilled in the art is able to adapt this description to the case where the node 104 receives the positive potential Vdd with respect to ground and the node 404 described in connection with FIG. 5 receives the ground potential, for example by replacing all of the described N-channel MOS transistors with P-channel MOS transistors.

Various embodiments and variants have been described. Those skilled in the art will understand that certain features of these embodiments can be combined and other variants will readily occur to those skilled in the art.

Finally, the practical implementation of the embodiments and variants described herein is within the capabilities of those skilled in the art based on the functional description provided hereinabove.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A frequency doubler comprising:
  a first transistor and a second transistor connected in parallel between a first differential output and a first terminal of a current source, wherein the current source is configured to provide a bias current, and wherein a second terminal of the current source is connected to a supply potential;
  a third transistor connected between a second differential output and the first terminal of the current source; and
  a feedback loop configured to control a first voltage to a gate of the first transistor, a second voltage to a gate of the second transistor and a third voltage to a gate of the third transistor based on a difference between DC components of the first and second differential outputs,
  wherein the feedback loop comprises a first input coupled to the first differential output, a second input coupled to the second differential output and an output configured to provide an output voltage, and
  wherein the feedback loop further comprises:
    an operational amplifier;
    a capacitor connected between a non-inverting input of the amplifier and the supply potential;
    a capacitor connected between an inverting input of the amplifier and an output of the amplifier;
    a first resistor coupling the non-inverting input to the first input of the feedback loop; and
    a second resistor coupling the inverting input to the second input of the feedback loop,
  wherein, in a first implementation, the first input of the feedback loop is coupled to the first differential output and the second input of the feedback loop is coupled to the second differential output for controlling the third voltage, and
  wherein, in a second implementation, the first input of the feedback loop is coupled to the second differential output and the second input of the feedback loop is coupled to the first differential output for controlling the first and second voltages.

2. The frequency doubler of claim 1, further comprising a circuit configured to:
  provide, at a first output of the circuit, the first voltage being based on the output voltage of the feedback loop when the first voltage is controllable by the feedback loop;
  provide, at a second output of the circuit, the second voltage being based on the output voltage of the feedback loop when the second voltage is controllable by the feedback loop; and
  provide, at a third output of the circuit, a constant voltage as the third voltage.

3. The frequency doubler of claim 2, wherein the circuit further comprises:
  a first capacitor coupling a first differential input to the gate of the first transistor; and
  a second capacitor coupling a second differential input to the gate of the second transistor.

4. The frequency doubler of claim 3, wherein the circuit further comprises:
  a first resistor coupling the gate of the first transistor to a first node configured to receive the output voltage of the feedback loop; and
  a second resistor coupling the gate of the second transistor to the first node.

5. The frequency doubler of claim 4, wherein the circuit further comprises a third capacitor coupling the first node to the supply potential.

6. The frequency doubler of claim 2, wherein the circuit further comprises a transformer having its primary coupled to the first and second differential inputs, and its secondary coupled to the gates of the first and second transistors, the secondary being configured to be biased by the output voltage of the feedback loop.

7. The frequency doubler of claim 1, further comprising a circuit configured to:
  provide, at a first output of the circuit, a constant voltage as the first voltage;
  provide, at a second output of the circuit, the constant voltage as the second voltage; and provide, at a third output of the circuit, the third voltage being based on the output voltage of the feedback loop when the third voltage is controllable by the feedback loop.

8. The frequency doubler of claim 7, wherein the circuit further comprises:
a first capacitor coupling a first differential input to the gate of the first transistor; and
a second capacitor coupling a second differential input to the gate of the second transistor.

9. The frequency doubler of claim 7, wherein the circuit further comprises:
a first resistor coupling the gate of the first transistor to a first node configured to receive the output voltage of the feedback loop; and
a second resistor coupling the gate of the second transistor to the first node.

10. The frequency doubler of claim 9, wherein the circuit further comprises a third capacitor coupling the first node to the supply potential.

11. The frequency doubler of claim 7, wherein the circuit further comprises a fourth capacitor and a second node between the third output and a third input of the circuit, and wherein the fourth capacitor couples the second node to the supply potential.

12. The frequency doubler of claim 1, wherein the first and second transistors are identical N-channel MOS transistors.

13. The frequency doubler of claim 12, wherein the third transistor is an N-channel MOS transistor identical to the first and second transistors.

14. A frequency doubler comprising:
a first transistor and a second transistor connected in parallel between a first differential output and a first terminal of a current source, wherein the current source is configured to provide a bias current, and wherein a second terminal of the current source is connected to a supply potential;
a third transistor connected between a second differential output and the first terminal of the current source; and
a feedback loop configured to control a first voltage to a gate of the first transistor or a second voltage to a gate of the second transistor based on a difference between DC components of the first and second differential outputs, wherein the feedback loop comprises a first input coupled to the second differential output, a second input coupled to the first differential output and an output configured to provide an output voltage, and
wherein the feedback loop further comprises:
an operational amplifier;
a capacitor connected between a non-inverting input of the amplifier and the supply potential;
a capacitor connected between an inverting input of the amplifier and an output of the amplifier;
a first resistor coupling the inverting input to the first input of the feedback loop; and
a second resistor coupling the non-inverting input to the second input of the feedback loop, wherein the first and second voltages are controllable by the output voltage.

15. The frequency doubler of claim 14, further comprising a circuit configured to:
provide, at a first output of the circuit, the first voltage based on the output voltage of the feedback loop;
provide, at a second output of the circuit, the second voltage based on the output voltage of the feedback loop; and
provide, at a third output of the circuit, a constant voltage as a third voltage to a gate of the third transistor.

16. The frequency doubler of claim 15, wherein the circuit further comprises:
a first capacitor coupling a first differential input to the gate of the first transistor; and
a second capacitor coupling a second differential input to the gate of the second transistor.

17. The frequency doubler of claim 16, wherein the circuit further comprises:
a first resistor coupling the gate of the first transistor to a first node, the first node configured to receive the output voltage of the feedback loop;
a second resistor coupling the gate of the second transistor to the first node; and
a third capacitor coupling the first node to the supply potential.

18. A frequency doubler comprising:
a first transistor and a second transistor connected in parallel between a first differential output and a first terminal of a current source, wherein the current source is configured to provide a bias current, and wherein a second terminal of the current source is connected to a supply potential;
a third transistor connected between a second differential output and the first terminal of the current source; and
a feedback loop configured to control a third voltage to a gate of the third transistor based on a difference between DC components of the first and second differential outputs,
wherein the feedback loop comprises a first input coupled to the first differential output, a second input coupled to the second differential output and an output configured to provide an output voltage, and
wherein the feedback loop comprises:
an operational amplifier;
a capacitor connected between a non-inverting input of the amplifier and the supply potential;
a capacitor connected between an inverting input of the amplifier and an output of the amplifier;
a first resistor coupling the inverting input to the first input of the feedback loop; and
a second resistor coupling the non-inverting input to the second input of the feedback loop, wherein the third voltage is controllable by the output voltage.

19. The frequency doubler of claim 18, further comprising a circuit configured to:
provide, at a first output of the circuit, a constant voltage to a gate of the first transistor;
provide, at a second output of the circuit, the constant voltage to the gate of the second transistor; and
provide, at a third output of the circuit, the third voltage based on the output voltage of the feedback loop.

20. The frequency doubler of claim 19, wherein the circuit further comprises:
a first capacitor coupling a first differential input to the gate of the first transistor; and
a second capacitor coupling a second differential input to the gate of the second transistor.

* * * * *